United States Patent
Wang et al.

(10) Patent No.: US 7,705,361 B2
(45) Date of Patent: Apr. 27, 2010

(54) HETEROJUNCTION BIPOLAR TRANSISTOR HAVING (IN)(AL) GAASSB/INGAAS BASE-COLLECTOR STRUCTURE

(75) Inventors: Sheng-Yu Wang, Taoyuan County (TW); Jen-Inn Chyi, Taoyuan County (TW); Shu-Han Cheng, Taoyuan County (TW)

(73) Assignee: National Central University, Jhongli, Taoyuan (TW)

( * ) Notice: Subject to any disclaimer, the term of this patent is extended or adjusted under 35 U.S.C. 154(b) by 215 days.

(21) Appl. No.: 11/808,271

(22) Filed: Jun. 7, 2007

(65) Prior Publication Data

US 2008/0173874 A1 Jul. 24, 2008

(51) Int. Cl.
*H01L 3/256* (2006.01)
(52) U.S. Cl. ................. 257/76; 257/E51.016
(58) Field of Classification Search ............ 257/197, 257/565, 189, 76, E51.016; 438/205, 312, 438/317
See application file for complete search history.

(56) References Cited

U.S. PATENT DOCUMENTS

| | | | |
|---|---|---|---|
| 5,989,738 A * | 11/1999 | Haase et al. ............... 428/690 |
| 2004/0224463 A1 * | 11/2004 | McHugo et al. ............ 438/235 |
| 2005/0023643 A1 * | 2/2005 | Li et al. ..................... 257/565 |
| 2005/0054172 A1 * | 3/2005 | Feng et al. ................. 438/313 |
| 2005/0184312 A1 * | 8/2005 | Sawdai et al. ............. 257/197 |
| 2006/0065952 A1 * | 3/2006 | Boos et al. ................. 257/565 |
| 2007/0018192 A1 * | 1/2007 | Salzman et al. ........... 257/103 |

* cited by examiner

*Primary Examiner*—Jerome Jackson, Jr.
*Assistant Examiner*—Dale Page
(74) *Attorney, Agent, or Firm*—Jackson IPG PLLC

(57) ABSTRACT

A heterojunction bipolar transistor (HBT) has a (In)(Al) GaAsSb/InGaAs base-collector structure. A discontinuous base-collector conduction band forms a built-in electric field to infuse electrons into a collector structure effectively, while a discontinuous base-collector valence band prevents holes from spreading into the collector structure at the same time. Thus, a current density is increased. In addition, the small offset voltage of the base-emitter and base-collector junctions reduce a power consumption.

5 Claims, 12 Drawing Sheets

| | |
|---|---|
| Emitter cap | InGaAs |
| Emitter cap | InP |
| Emitter | InP |
| Base | (In)(Al)GaAsSb |
| Collector I | InGaAs |
| Collector II | InGaAs(Al)(P)(Sb) |
| Collector | InP |
| Sub-Collector | InGaAs |
| Substrate | InP |

| | |
|---|---|
| Emitter cap | InGaAs |
| Emitter cap | InP |
| Emitter | InP |
| Base | (In)(Al)GaAsSb |
| Collector I | InGaAs |
| Collector II | InGaAs(Al)(P)(Sb) |
| Collector | InP |
| Sub-Collector | InGaAs |
| Substrate | InP |

FIG.7

| Emitter cap | InGaAs |
| Emitter cap | InP |
| Emitter | InP |
| Base | InGaAs |
| Collector | InGaAs |
| Sub-Collector | InGaAs |
| Substrate | InP |

FIG. 10
(Prior art)

| Layer | Material |
|---|---|
| Emitter cap | InGaAs |
| Emitter cap | InP |
| Emitter | InP |
| Base | InGaAs graded |
| Collector | InGaAs graded |
| | InGaAs |
| Sub-Collector | |
| Substrate | InP |

FIG. 11
(Prior art)

| | |
|---|---|
| Emitter cap | InGaAs |
| Emitter cap | InP |
| Emitter | InP |
| Base | InGaAs |
| Collector I | InGaAs |
| Collector II | InGaAs(Al)(P)(Sb) |
| Collector III | InP |
| Sub-Collector | InGaAs |
| Substrate | InP |

FIG. 12
(Prior art)

HETEROJUNCTION BIPOLAR TRANSISTOR HAVING (IN)(AL) GAASSB/INGAAS BASE-COLLECTOR STRUCTURE

FIELD OF THE INVENTION

The present invention relates to a heterojunction bipolar transistor (HBT); more particularly, relates to obtaining an HBT having a high cut-off frequency and a low power dissipation.

DESCRIPTION OF THE RELATED ARTS

Traditionally, an InGaAs single HBT is the transistor having the highest cut-off frequency, while its collector structure is usually used as a part of an optical electric integrated circuit.

In FIG. 10 and FIG. 11, views of a general single HBT and a general collector-base graded single HBT are shown. When electrons pass through a base structure of a general single HBT, electrons are not quickly transferred to a collector structure; and, owing to the continuous valence band of both two HBTs, holes are hard to be stopped from spreading from the base into the collector under a high current infused, so that a high current density is hard to be obtained.

FIG. 12 is a structural view of a general InGaAs composite collector bipolar transistor. The transistor having a composite collector structure utilizes a separating layer of InGaAs to smooth a discontinuous energy gap of a junction between InGaAs and InP; so, when electrons are transferred in the collector structure, they are not easily hindered by a discontinuous conduction band.

However, because of a discontinuous conduction band in a base-collector interface, electrons are still hindered to a certain extent during the transference for obtaining a better transferring speed, not to mention that a high current density are hard to be achieved either. Hence, the prior arts do not fulfill all users' requests on actual use.

SUMMARY OF THE INVENTION

The main purpose of the present invention is to effectively infusing electrons from a base structure into a collector structure while an electron transference is improved with a high drift velocity in a low electric-field collector area.

Second purpose of the present invention is to stop holes from infusing from a base structure into a collector structure by utilizing a discontinuous valence band at a junction between an (In)(Al)GaAsSb base and an InGaAs collector, where a base is tied from expansion.

Third purpose of the present invention is to lower a collector-emitter off-set voltage for reducing a power dissipation by a small electron affinity difference between an (In)(Al) GaAsSb base structure and an emitter material as InP or InAlAs.

Fourth purpose of the present invention is to lower a discontinuous conduction band of a junction between a collector I of InP and a collector II of InGaAs in a composite collector structure for increasing a current density.

To achieve the above purposes, the present invention is a HBT having a (In)(Al)GaAsSb/InGaAs base-collector structure, comprising a substrate, a sub-collector contact layer, a first collector structure, a base structure, an emitter structure and an emitter contact layer, where a second collector structure and a third collector structure is added between the first collector structure and the sub-collector contact layer; the base structure is grown through lattice matching or pseudomorphic growth; the first collector structure is grown adjacent to the base to obtain a type II collector-base junction; the second collector structure is obtained on the third collector structure through a graded growth. Accordingly, a novel collector-base HBT using (In)(Al)GaAsSb/InGaAs is obtained.

BRIEF DESCRIPTION OF THE DRAWINGS

The present invention will be better understood from the following detailed descriptions of the preferred embodiments according to the present invention, taken in conjunction with the accompanying drawings, in which

FIG. 7 is the compositional view showing the composite collector bipolar transistor with a (In)(Al)GaAsSb base-collector structure;

FIG. 10 is the compositional view of the general single HBT;

FIG. 11 is the compositional view of the general pseudomorphic graded single HBT; and FIG. 12 is the compositional view of the general InGaAs base-collector bipolar transistor.

DESCRIPTIONS OF THE PREFERRED EMBODIMENTS

The following descriptions of the preferred embodiments are provided to understand the features and the structures of the present invention.

Figure 1:
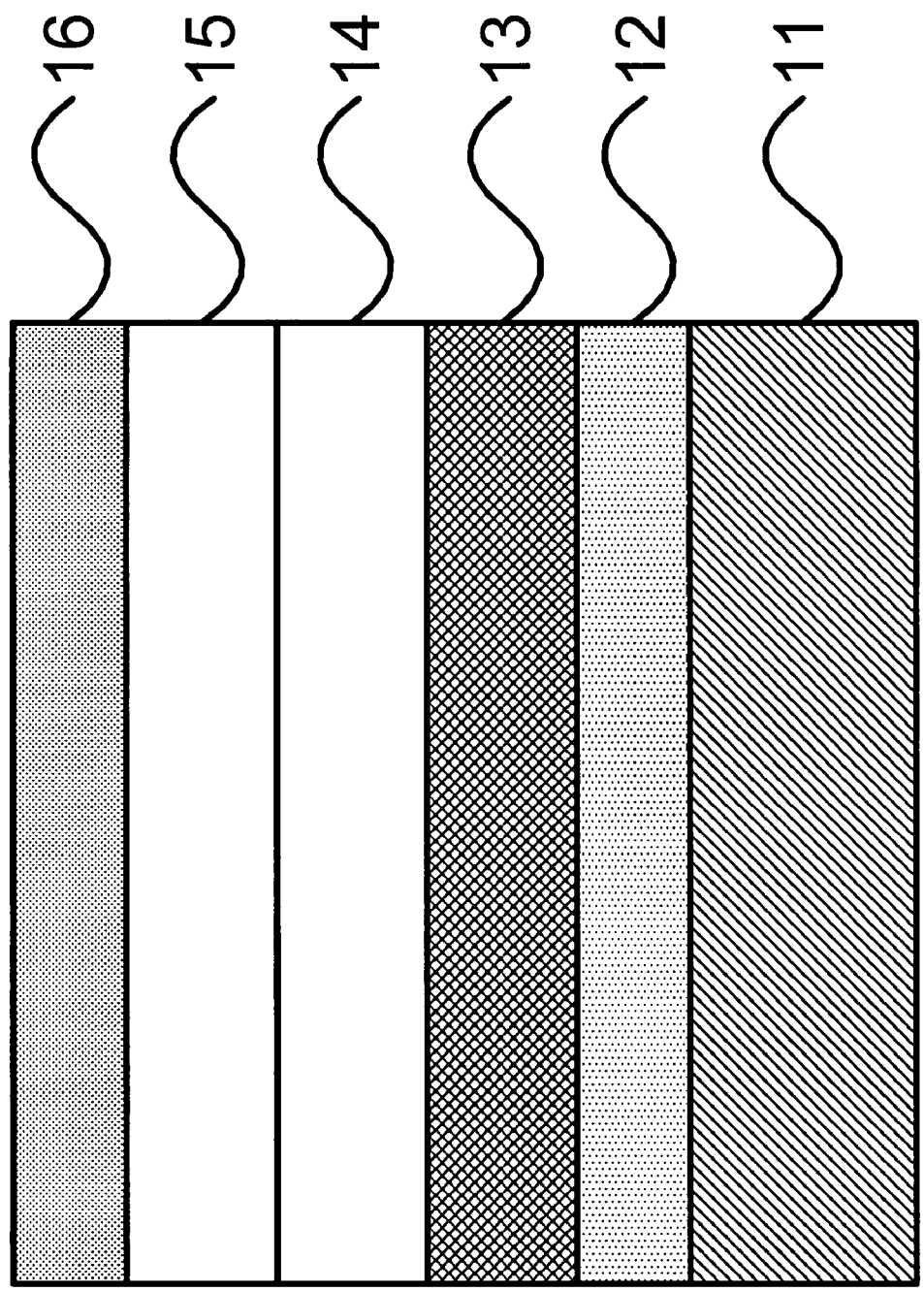
FIG. 1 is the structural view showing the HBT having the (In)(Al)GaAsSb/InGaAs base-collector structure according to the present invention.
Figure 2:
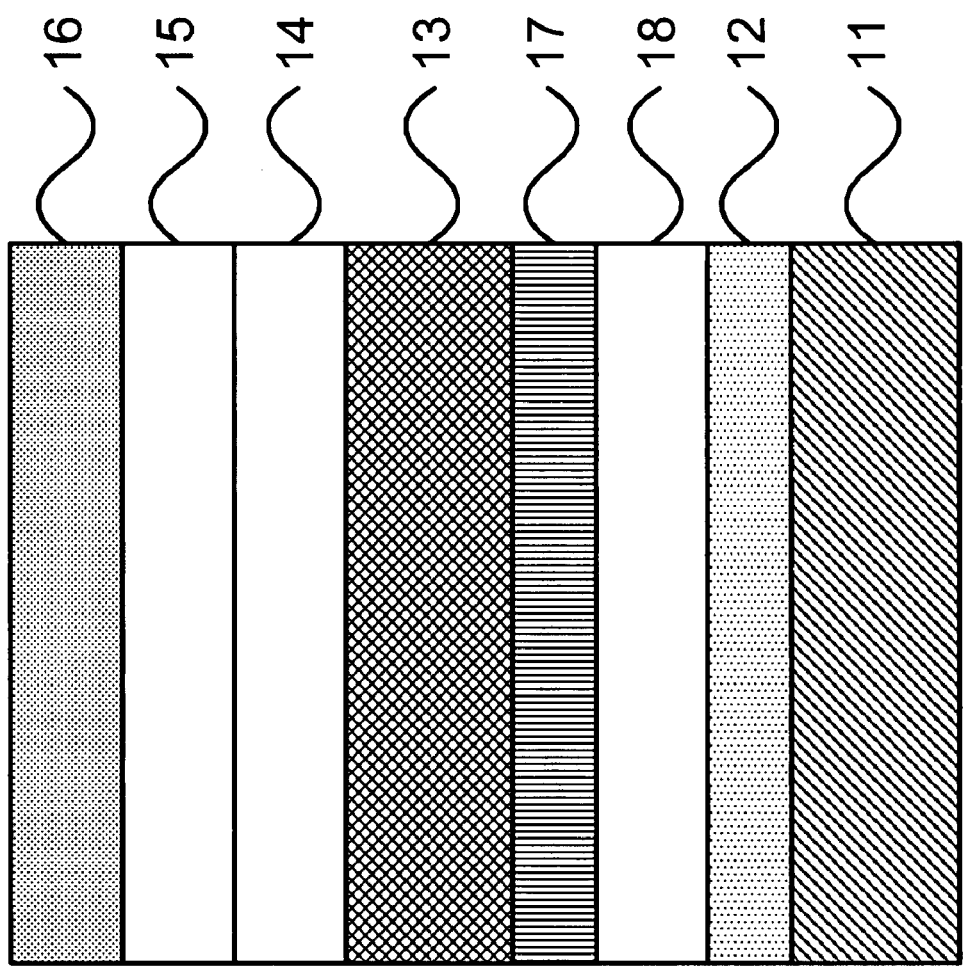
FIG. 2 is the structural view showing the HBT further comprising the second collector structure and the third collector structure.

Please refer to FIG. 1 and FIG. 2, which are structural views showing a heterojunction bipolar transistor (HBT) having an (In)(Al)GaAsSb/InGaAs base-collector structure; and the HBT further comprising a second collector structure and a third collector structure according to the present invention. As shown in the figures, the present invention is an HBT having an (In)(Al)GaAsSb/InGaAs base-collector structure, comprising a substrate 11, a sub-collector contact layer 12, a first collector structure 13, a base structure 14, an emitter structure 15 and an emitter contact layer 16.

As shown in FIG. 2, a second collector structure 17 and a third collector structure 18 are added between the first collector structure 13 and the sub-collector contact layer 12.

The base structure 14 is grown on the first collector structure 13 through lattice matching or pseudomorphic growth the collector structure 13 is grown adjacent to the base structure 14 to obtain a type II base-collector junction; and the second collector structure 17 is obtained on the third collector structure 18 through a graded growth. Therein, the substrate 11 is made of InP, or is made of GaAs graded into InP; the sub-collector contact layer 12 is made of InGaAs, or is made of a composite structure of InGaAs and InP; the third collector structure 18 is made of a material having a wide band gap, which is InP or InAlAs; the second collector structure 17 is made of InGaAs, InGaAsSb, InGaAsP or AlInGaAs, which is a composition-graded layer obtained through a step graded growth, a super lattice growth or a compositional graded growth; an electron affinity of the graded layer is between that of the first collector structure 13 and that of the third collector structure 18; the first collector structure 13 is made of InGaAs or InGaAs(Sb)(P)(Al) to obtain a type II collector-base junction; the base structure 14 is made of $GaAs_{1-x}Sb_x$, $In_yGa_{1-y}As_{1-z}Sb_z$, $Al_aGa_{1-a}As_{1-b}Sb_b$ or $In_cGa_{1-c}As_dSb_{1-d}$ where x is between 0.3 and 0.8, y between 0 and 0.63, z between 0 and 0.8, a between 0 and 1, b between 0.3 and 0.8, c between 0.53 and 0.63 and d between 0.3 and 0.8; the emitter structure 15 is made of InP, InGaAs, InAlAs, InAlGaAs, InGaAsP, AlPSb or AlAsSb; and, the emitter contact layer 16 is made of a material having a narrow band gap, which is InGaAs, InAs or AsSb.

When using the present invention a type II (In)(Al)GaAsSb/InGaAs base-collector structure is applied to the first collector structure 13 and the base structure 14 of the HBT. With a discontinuous conduction band between the first collector structure 13 and the base structure 14, a built-in electric field is obtained to improve a saturation velocity of electrons by infusing the electrons from the base structure 14 into the first collector structure 13. The discontinuous valence band between the first collector structure 13 and the base structure 14 stops holes from spreading from the base structure 14 into the first collector structure 13, where these characteristics relate to a high electron saturation velocity and a high operational current density.

The junction between the emitter structure 15 and the base structure 14 also uses a characteristic of (In)(Al)GaAsSb base material related to low power applications, where the (In)(Al)GaAsSb has a smaller electron affinity to lower a threshold voltage of the junction between the emitter structure 15 and the base structure 14.

Figure 3:
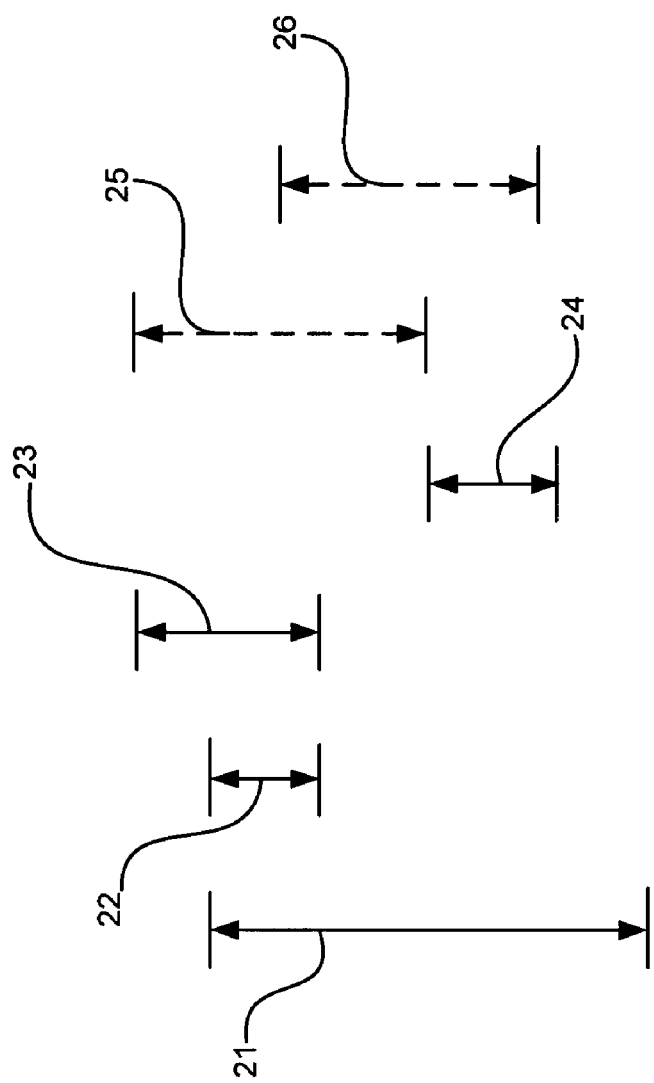
FIG. 3 is the view showing the energy bands of InP, InGaAs, GaAsSb and (In)(Al) GaAsSb.

Please refer to FIG. 3, which is a view showing the bands of InP, InGaAs, GaAsSb and (In)(Al)GaAsSb. As shown in the figure, an InP energy band is 1.35 eV; a GaAsSb energy band is 0.78 eV; and an (In)(Al)GaAsSb energy band is between 0.75 and 0.78 eV, where a conduction band difference between InP and InGaAs is 0.25 eV; a conduction band difference between InGaAs and GaAsSb is 0.44 eV; and a valence band difference between InGaAs and GaAsSb is 0.37 eV.

Figure 4:
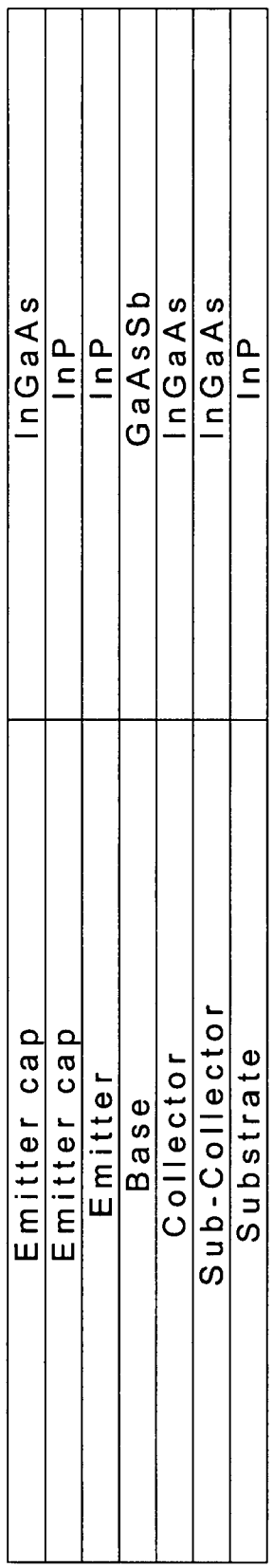
FIG. 4 is the compositional view showing the HBT having the GaAsSb/InGaAs base-collector structure.

Please refer to FIG. 4, which is a compositional view showing an HBT having a GaAsSb/InGaAs base-collector structure. As shown in the figure, when electrons pass through a base structure, the electrons are rapidly wiped to a collector structure by a built-in electric field. Because an HBT with a GaAsSb/InGaAs base-collector structure effectively stops holes from being spread in to the collector structure by the discontinuous valence band, the present invention has a high current density and a high electron saturation velocity with a general doping.

Figure 5:
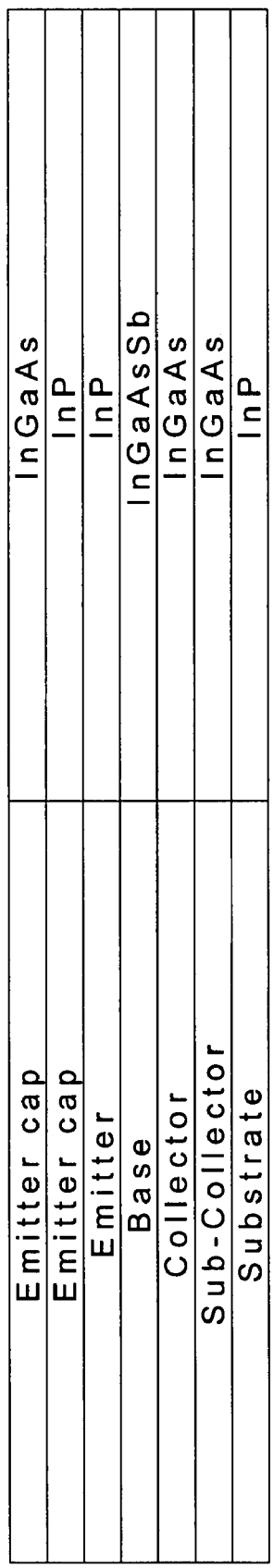
FIG. 5 is the compositional view showing the HBT having the InGaAsSb/InGaAs base-collector structure.

Please refer to FIG. 5, which is a compositional view showing an HBT having an InGaAsSb/InGaAs base-collector structure. As shown in the figure, an original material of InGaAs is replaced with a four-element material of InGaAsSb; and, through adjusting a content of Sb, a required emitter-base threshold voltage is obtained by referring to the following formula for an HBT:

$$Vbi = \frac{E_{gp} + \Delta E_C - \phi_p + \phi_n}{q}.$$

Thus, the present invention has a tunable threshold voltage

Figure 6:
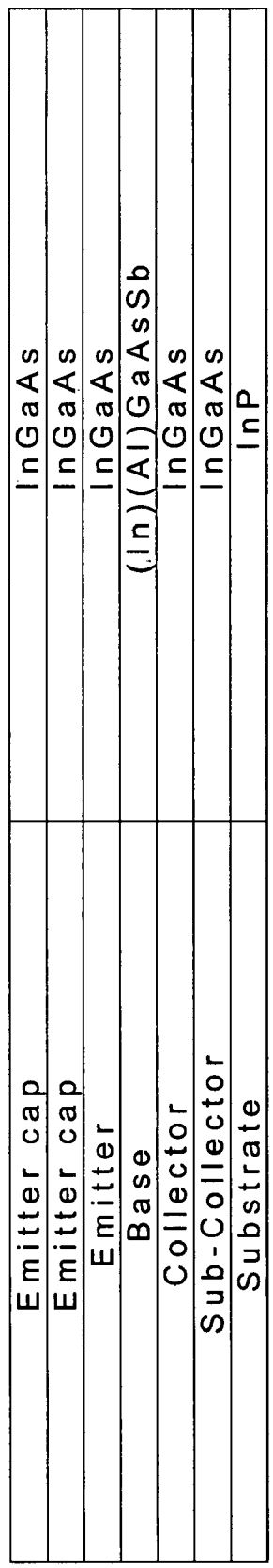
FIG. 6 is the composition a view showing the HBT having the (In)(Al)GaAsSb/InGaAs base-collector structure.

Please refer to FIG. 6, which is a compositional view showing the HBT having the (In)(Al)GaAsSb/InGaAs base-collector structure. As shown in the figure, in a process for growing epitaxy, P material is not used to lower a need for P material. In addition, because of a symmetric emitter-base junction and a collector-base junction, a shift voltage is minimized, which is of great help to obtain a low power consumption.

Please refer to FIG. 7, which is a compositional view showing the composite collector bipolar transistor with a (In)(Al)GaAsSb/InGaAs base-collector structure. As shown in the figure, an (In)(Al)GaAsSb base is used instead of commonly used InGaAs (as shown in FIG. 12), so that a position of a discontinuous conduction band is lowered and electrons are less hindered by discontinuous conduction bands.

Figure 8:
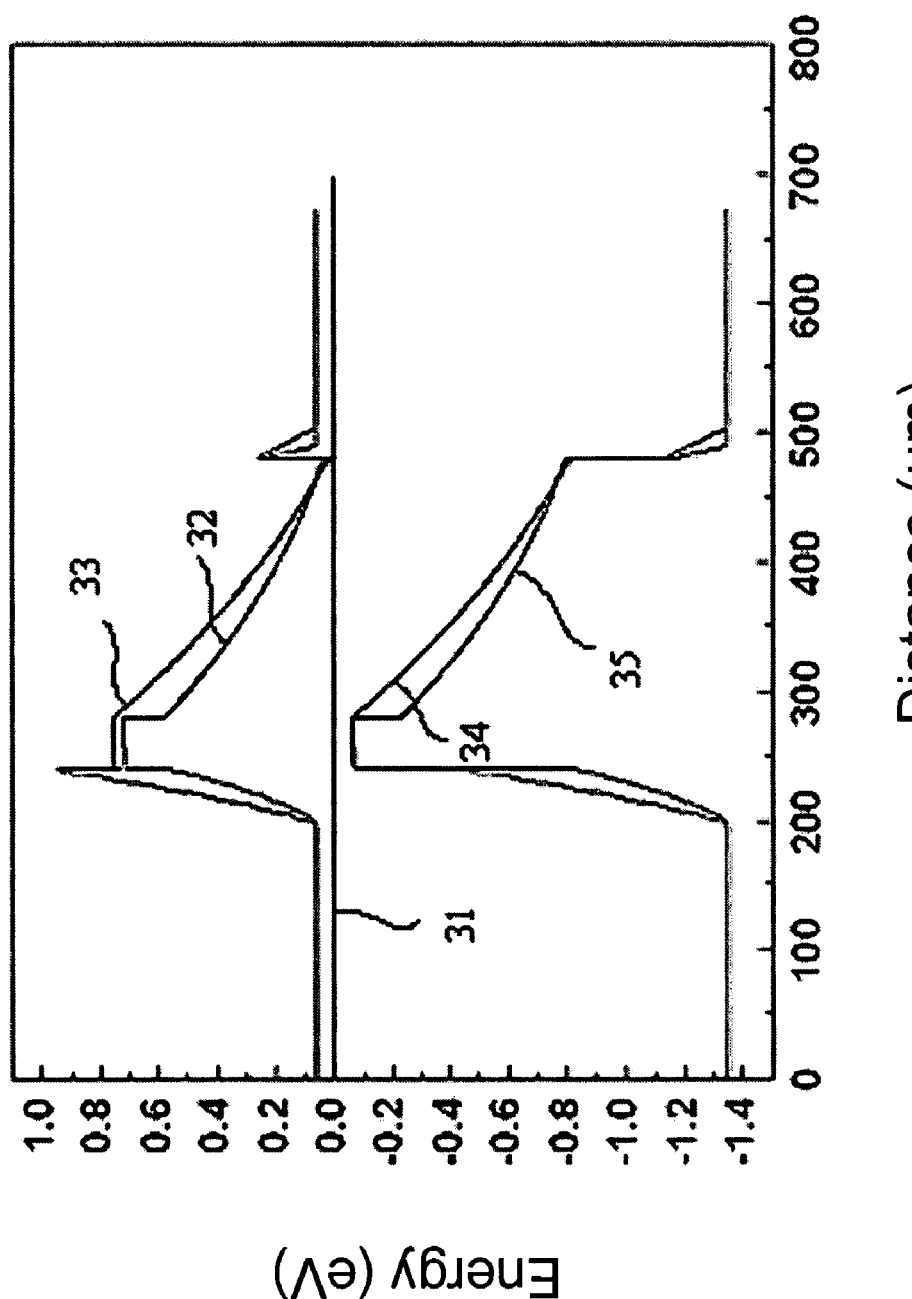
FIG. 8 is the view showing the energy bands of HBT having the (In)(Al)GaAsSb/InGaAs base-collector structure and the general InGaAs single HBT.

Please refer to FIG. 8, which is a view showing the energy bands of HBT having the (In)(Al)GaAsSb/InGaAs base-collector structure and the general InGaAs single HBT. As shown in the figure, there are a valence band of an InGaAs base HBT 34; a valence band of (In)(Al)GaAsSb HBT 35 above a Fermi level 31; a conduction band of InGaAs single HBT 32; and a conduction band of InGaAs single HBT 33. The (In)(Al)GaAsSb HBT 35 replaces a general InGaAs base structure, so that a biggest valence band at a base/collector interface prevents holes from being spread into a collector structure. Thus, under the same doping and the same collector structure, an apparently greater current densities than that in a general base structure are obtained. Moreover, because the discontinuous conduction bands between a base and an emitter are lowered, a threshold voltage, which is originally bigger than that of a collector-base junction, is improved and a collector-emitter offset voltage of the transistor is thus improved as well.

Figure 9:
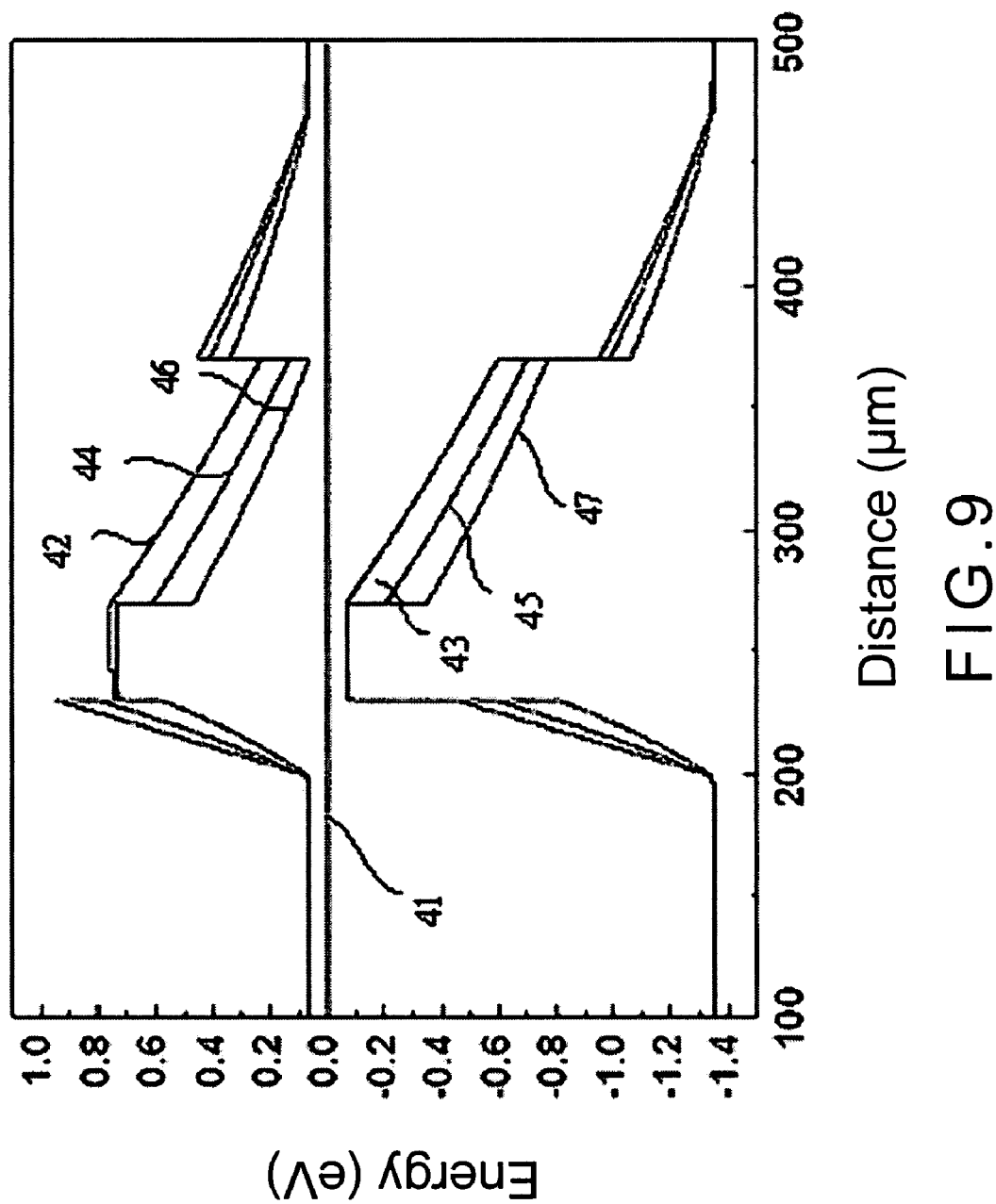
FIG. 9 is the view showing the energy bands of the GaAsSb, InGaAsSb and InGaAs base-collector HBT.

Please refer to FIG. 9, which is a view showing the energy bands of the GaAsSb, InGaAsSb and InGaAs base-collector HBT. As shown in the figure, there are a conduction band of a transistor having an (In)(Al)GaAsSb composite collector structure 44; a valence band of a transistor having an (In)(Al)GaAsSb composite collector structure 45; a conduction band of a transistor having a GaAsSb composite collector structure 46; a valence band of a transistor having a GaAsSb composite collector structure 47; a conduction band of a transistor having an InGaAs composite collector structure 42; a valence band of a transistor having an InGaAs composite collector structure 43; and a Fermi level 41. On comparing to the InGaAs base collector HBT, a discontinuous valence band at a base-collector interface prevents holes from being spread into the collector structure. Moreover, the staggered band lineup of a base-collector structure of the GaAsSb and InGaAsSb HBTs lower positions of discontinuous conduction bands between a collector I of InP and a collector II of InGaAs for obtaining high current densities.

Thus, under the same doping and the same collector structure, an apparently greater current density than that in a general base structure is obtained. Besides, because the discontinuous conduction bands in a base-emitter structure are lowered, a threshold voltage, which is originally bigger than that for a collector-base junction, is improved and a shift voltage of the transistor is thus improved as well.

To sum up, the present invention is an HBT having an (In)(Al)GaAsSb/InGaAs base-collector structure, where the HBT has a small conduction band discontinuity at a base-emitter junction and leads to a small turn on voltage; a larger valence band discontinuity at the base-collector junction prevents injection of holes from the base to the emitter and gives rise to a higher emitter current injection efficiency; a staggered band lineup at the base-collector junction gives electrons a higher injection velocity and a higher drift saturation velocity associated with a low field collector region; an aforementioned large valance band discontinuity between the base and a collector I of InP prevents the holes from being injected from the base into the collector; and thus good characteristics of a high cut-off frequency, a high current density and a low power dissipation are obtained.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A heterojunction bipolar transistor (HBT) having an (In)(Al)GaAsSb/InGaAs base-collector structure, comprising:
    a substrate;
    a sub-collector contact layer;
    a collector structure;
    a base structure;
    an emitter structure; and
    an emitter contact layer,
    wherein said base structure is made of InAlGaAsSb,
    wherein said base structure is made of a material selected from a group consisting of $In_yGa_{1-y}As_{1-z}Sb_z$ and $Al_aGa_{1-a}As_{1-b}Sb_b$; and
    wherein said y is a value between 0 and 0.63, said z is a value between 0 and 0.8, said a is a value between 0 and 1, and said b is a value between 0.3 and 0.8.

2. The HBT according to claim 1, wherein said collector structure is grown adjacent to said base structure to obtain a type II collector-base junction; and
    wherein said collector structure is made of a material selected from a group consisting of InGaAs, InGaAsSb, (P)InGaAs and (AI)InGaAs.

3. The HBT according to claim 1, wherein said base structure is obtained through a growth of lattice matching, a pseudomorphic growth, or a compositional graded growth.

4. The HBT, according to claim 1, wherein said emitter structure is made of a material selected from a group consisting of InP, InAlGaAs, InGaAsP, AlPSb and AlAsSb.

5. The HBT according to claim 1, wherein said emitter contact layer is made of a material having a narrow band gap; and
    wherein said material is selected from a group consisting of InGaAs, InAs and AsSb.

* * * * *

UNITED STATES PATENT AND TRADEMARK OFFICE
CERTIFICATE OF CORRECTION

PATENT NO. : 7,705,361 B2 Page 1 of 1
APPLICATION NO. : 11/808271
DATED : April 27, 2010
INVENTOR(S) : Sheng-Yu Wang et al.

It is certified that error appears in the above-identified patent and that said Letters Patent is hereby corrected as shown below:

On the title page item (75) should read: Inventors:   Sheng-Yu Wang, Taoyuan County (TW);
Jen-Inn Chyi, Taoyuan County (TW);
Shu-Han Chen, Taoyuan County (TW)

Signed and Sealed this

Seventh Day of September, 2010

David J. Kappos
*Director of the United States Patent and Trademark Office*